United States Patent
Jung et al.

(10) Patent No.: US 10,249,781 B2
(45) Date of Patent: Apr. 2, 2019

(54) APPARATUS FOR COUNTING SINGLE PHOTONS AND METHOD THEREOF

(71) Applicant: INDUSTRY—ACADEMIC COOPERATION FOUNDATION, YONSEI UNIVERSITY, Seoul (KR)

(72) Inventors: Seong-Ook Jung, Seoul (KR); Jung Hyun Park, Seoul (KR); Ki Ryong Kim, Seoul (KR)

(73) Assignee: INDUSTRY—ACADEMIC COOPERATION FOUNDATION, YONSEI UNIVERSITY, Seoul (KR)

( * ) Notice: Subject to any disclaimer, the term of this patent is extended or adjusted under 35 U.S.C. 154(b) by 218 days.

(21) Appl. No.: 15/492,434

(22) Filed: Apr. 20, 2017

(65) Prior Publication Data

US 2017/0307441 A1  Oct. 26, 2017

(30) Foreign Application Priority Data

Apr. 21, 2016  (KR) .................. 10-2016-0048866

(51) Int. Cl.
| | | |
|---|---|---|
| *G01J 1/44* | (2006.01) | |
| *H01L 31/107* | (2006.01) | |
| *H01L 27/146* | (2006.01) | |
| *H01L 31/02* | (2006.01) | |

(52) U.S. Cl.
CPC ...... *H01L 31/107* (2013.01); *H01L 27/14643* (2013.01); *H01L 31/02027* (2013.01); *G01J 2001/442* (2013.01); *G01J 2001/4466* (2013.01)

(58) Field of Classification Search
CPC ............ H01L 31/107; H01L 31/02027; H01L 27/14643; G01J 2001/442; G01J 2001/4466
USPC ........................................................ 250/207
See application file for complete search history.

(56) References Cited

U.S. PATENT DOCUMENTS

| | | | |
|---|---|---|---|
| 7,436,265 B2 | 10/2008 | Park et al. | |
| 2011/0180726 A1* | 7/2011 | Gratton | G01J 3/4406 |
| | | | 250/459.1 |
| 2017/0115381 A1* | 4/2017 | Moore | G01S 7/4865 |

FOREIGN PATENT DOCUMENTS

| | | |
|---|---|---|
| JP | 2009-192322 A | 8/2009 |
| KR | 10-2015-0145360 A | 5/2001 |
| KR | 10-2014-0132829 A | 11/2014 |
| KR | 10-2015-0121291 A | 10/2015 |

OTHER PUBLICATIONS

Nikola Krstajic, et al., "256 X 2 SPAD line sensor for time resolved fluorescence spectroscopy", Optics Express, 2015, pp. 5653-5669, vol. 23, No. 5.

(Continued)

*Primary Examiner* — Seung C Sohn
(74) *Attorney, Agent, or Firm* — Sughrue Mion, PLLC

(57) ABSTRACT

Disclosed is an apparatus for counting single photons including an edge combiner configured to detect an edge of each of applied clocks using a plurality of Phase-Locked Loops (PLL) to generate a combined signal; a sampling unit configured to sample all events occurring in each SPAD of a single photon detection diode (SPAD) array using an OR tree and an XOR tree; and a calculation unit configured to count the sampled events based on the combined signal to count single photons.

11 Claims, 11 Drawing Sheets

(56) References Cited

OTHER PUBLICATIONS

Salvatore Gnecchi, et al., "Digital Silicon Photomultipliers With OR/XOR Pulse Combining Techniques", IEEE Transactions on Electron Devices, Jan. 26, 2016, pp. 1105-1110, vol. 63, No. 3.
M. Gersbach, et al., "A parallel 32×32 Time-To-Digital Converter Array Fabricated in a 130 nm Imaging CMOS Technology", ESSCIRC, IEEE, Sep. 2009, pp. 196-199.
Korea Office Action for Application No. 10-2016-0048866 dated Jan. 6, 2017.
Communication dated Jun. 28, 2017 from the Korean Intellectual Property Office in corresponding Korean Patent Application No. 10-2016-0048866.

* cited by examiner

XOR gate

OR gate

APPARATUS FOR COUNTING SINGLE PHOTONS AND METHOD THEREOF

CROSS-REFERENCE TO RELATED APPLICATION

This application claims the priority benefit of Korean Patent Application No. 10-2016-0048866, filed on Apr. 21, 2016 in the Korean Intellectual Property Office, the disclosure of which is incorporated herein by reference.

BACKGROUND OF THE DISCLOSURE

Field of the Disclosure

The present disclosure relates to an apparatus for counting single photons generated by a Single Photon Avalanche Diode (SPAD) that is activated by a reflected light source, and a method of counting single photons.

Description of the Related Art

For applications using fluorescence lifetime, an SPAD may be used to increase sensitivity. Due to high sensitivity of such SPAD, there is a difficulty that light is activated by ambient light and heat and thus fluorescence photons of a light source are not detected. For applications using Time of Flight (ToF), an SPAD may be used to increase sensitivity. However, during one cycle in which the SPAD is driven, photons activated second or later are not detected, whereby pile-up distortion occurs in detection and routing processes.

Accordingly, a technology of, in a process using an SPAD to increase sensitivity, post-processing a signal detected in the SPAD so as to accurately calculate single photons activated by a light source to be detected is being developed.

RELATED DOCUMENTS

Patent Documents

Korean Patent Application Publication No. 10-2015-0145360, entitled "ALL-DIGITAL PHASE-LOCKED LOOP WITH FINE MULTI-SAMPLING TIME-TO-DIGITAL CONVERTER AND METHOD FOR OPERATING THEREOF"

U.S. Pat. No. 7,436,265, entitled "CLOCK GENERATOR AND CLOCK GENERATING METHOD USING DELAY LOCKED LOOP"

Non-Patent Documents

Journal: 256 2 SPAD line sensor for time resolved fluorescence spectroscopy (Optics Express v. 23 no. 5, pp. 5653-5669, 2015)

SUMMARY OF THE DISCLOSURE

Therefore, the present disclosure has been made in view of the above problems, and it is one object of the present disclosure to provide an apparatus for accurately counting photons in SPAD activated by a light source that is reflected by the object of interest, and a method of counting the photons.

More particularly, it is one object of the present disclosure to provide an apparatus for accurately counting photons of interest by using events sampled using both an OR tree and an XOR tree and counting the events by means of a histogramming Time to Digital Converter (TDC), and a method thereof.

In accordance with an aspect of the present disclosure, the above and other objects can be accomplished by the provision of an apparatus for counting single photons, including: an edge combiner configured to detect an edge of each of applied clocks using a plurality of Phase-Locked Loops (PLL) to generate a combined signal; a sampling unit configured to sample all events occurring in each SPAD of a single photon detection diode (SPAD) array using an OR tree and an XOR tree; and a calculation unit configured to count the sampled events based on the combined signal to count single photons.

The edge combiner may detect a rising edge of each of the clocks to generate the combined signal.

The edge combiner may detect a falling edge of each of the clocks to generate the combined signal.

The apparatus may further include a compensation unit for compensating propagation delay between the OR tree and the XOR tree using a Delay-Locked Loop (DLL).

The calculation unit may up-count two events when events are not sampled in the XOR tree and are sampled in the OR tree.

A pulse shaper connected to the OR tree and a T flip-flop connected to the XOR tree may use a flip-flop with a same structure, whereby the same propagation delay occurs.

An OR gate structure constituting the OR tree and an XOR gate structure constituting the XOR tree may be constituted of a route having same driving strength.

In accordance with another aspect of the present disclosure, provided is a method of counting single photons, the method comprising: detecting an edge of each of applied clocks using a plurality of Phase-Locked Loops (PLL) to generate a combined signal; sampling all events occurring in each SPAD of a single photon detection diode (SPAD) array using an OR tree and an XOR tree; and counting the sampled events based on the combined signal to count single photons.

The method may further include compensating propagation delay between the OR tree and the XOR tree using DLL.

In the counting, two events may be up-counted when events are not sampled in the XOR tree and are sampled in the OR tree.

In the generating, the combined signal may be generated by detecting a rising edge of each of the clocks.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE DISCLOSURE

Figure 1:
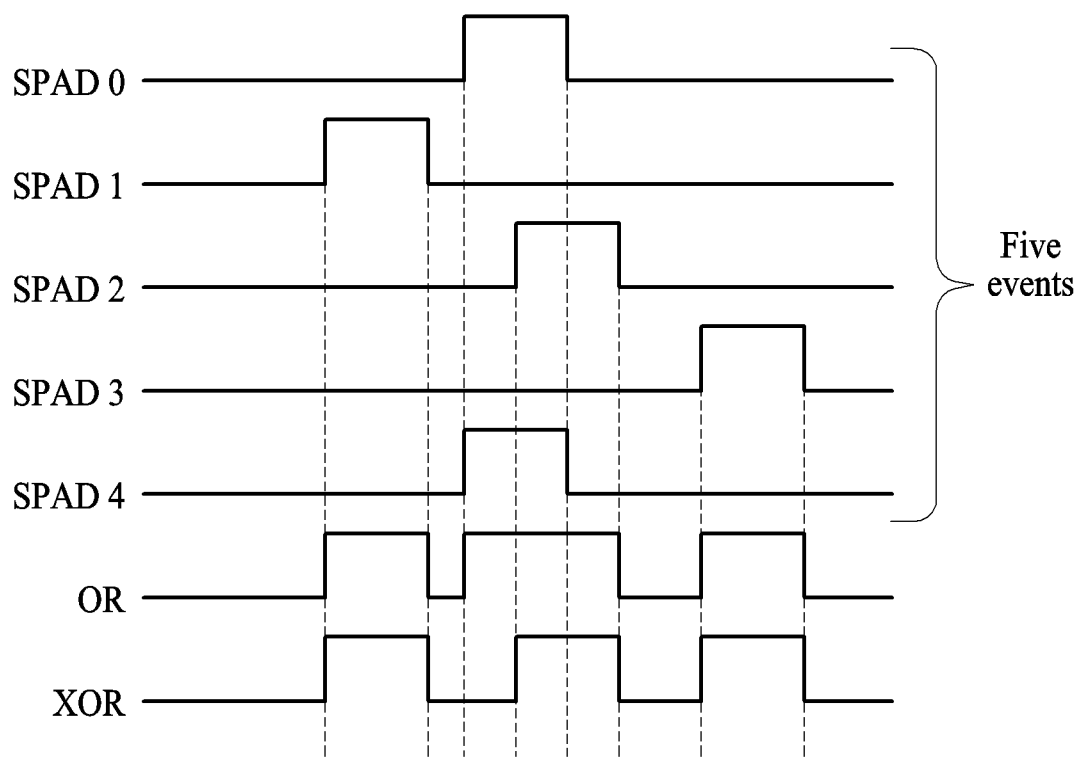
FIG. 1 is a view illustrating a problem that may occur upon application of a technology related to the present disclosure.

Hereinafter, embodiments of the present disclosure are more fully described with reference to the accompanying drawings.

As the disclosure allows for various changes and numerous embodiments, particular embodiments are illustrated in the drawings and described in detail in the written description. The attached drawings for illustrating exemplary embodiments of the present disclosure are referred to in order to clearly explain the effects and characteristics of the present disclosure and a method of accomplishing the present disclosure. The scope of the present disclosure is not limited to the following embodiments and can be embodied in various forms.

As used herein, the singular forms "a," "an" and "the" are intended to include the plural forms as well, unless the context clearly indicates otherwise.

It will be further understood that the terms "comprises" or "has" refer to the presence of features or constructions described herein, but do not preclude the possibility of one or more features or construction to be added.

FIG. 1 is a view illustrating a problem that may occur upon application of a technology related to the present disclosure.

FIG. 1 illustrates an example of the occurrence of an event of sensing a photon in an array constituted of five SPADs. From this, it can be confirmed that it is difficult to detect five events using an OR tree or an XOR tree.

In the case of the OR tree, events in SPAD 0 and SPAD 4, occurring at the same time, are detected as one event and an event occurring in SPAD 2 is not detected, whereby only three events are detected.

In the case of the XOR tree, events in SPAD 0 and SPAD 4, occurring at the same time, are not detected, whereby only three events are detected.

Accordingly, when only one of the OR tree and the XOR tree is used, it is difficult to detect all events occurring in an SPAD array.

Hereinafter, a structure configured to minimize and detect event errors occurring in an SPAD array is described.

Figure 2:
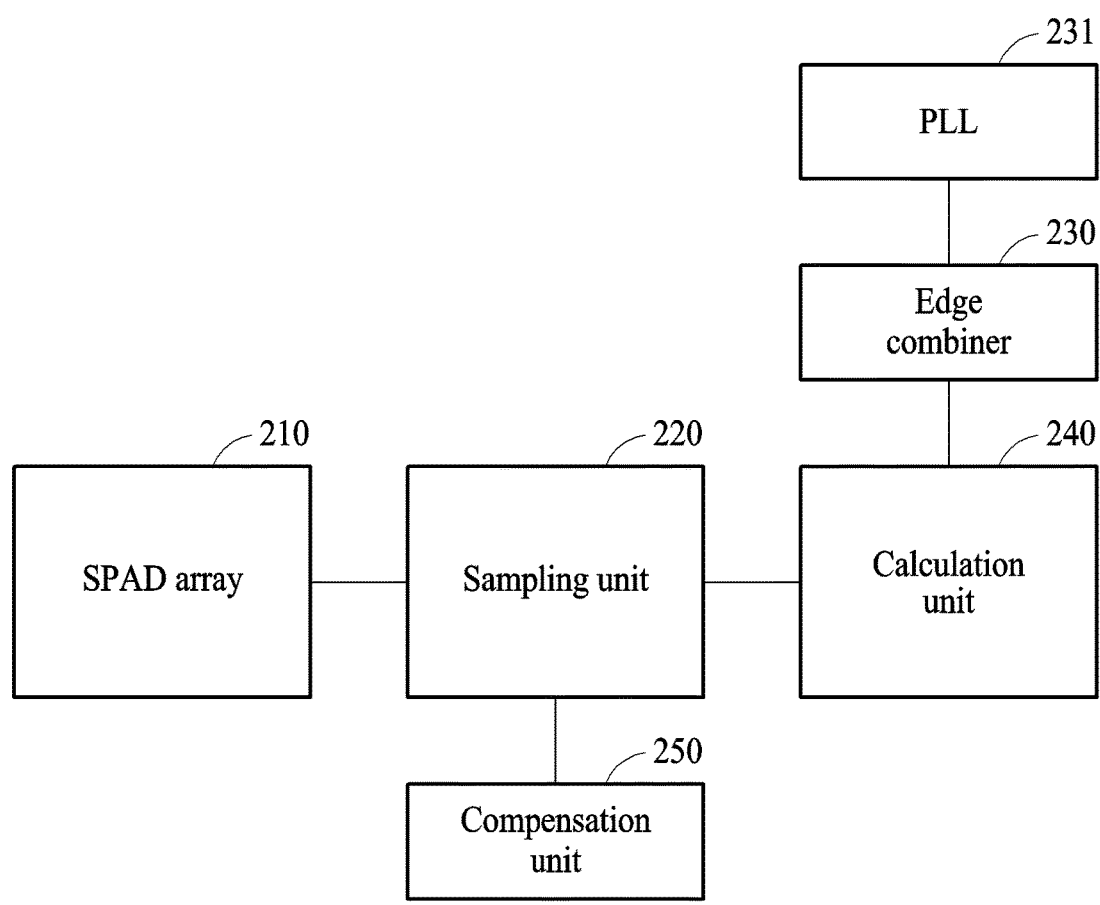
FIG. 2 is a block diagram illustrating an apparatus for counting single photons according to an embodiment of the present disclosure.

FIG. 2 is a block diagram illustrating an apparatus for counting single photons according to an embodiment of the present disclosure.

The apparatus for counting single photons according to an embodiment of the present disclosure 100 may include a sampling unit 220, an edge combiner 230, and a calculation unit 240, as basic constructions. The apparatus for counting single photons 100 may further include an SPAD array 210 and a compensation unit 250.

The SPAD array 210 is constituted of a plurality of SPADs, and converts an incident optical signal into a photon-unit electrical signal. Various kinds of SPADs may constitute one array.

The sampling unit 220 samples all events, which respectively occur in SPADs of the single-photon detection diode (SPAD) array, using an OR tree and an XOR tree. Here, the expression "event" refers to a case that an optical signal incident on an SPAD during one cycle is converted into a photon-unit electrical signal and output. The sampling unit 220 serializes signals, which are detected in the SPAD array, using both an OR tree and an XOR tree. Serialized events may be used to use one calculation unit 240. One calculation unit 240 may refer to one Time to Digital Converter (TDC), particularly a histogramming TDC.

The edge combiner 230 detects an edge of each clock using a plurality of Phase-Locked Loops (PLL, 231) to generate a combined signal. The edge combiner 230 uses both rising and falling edges of the PLL 231 for sampling, using Duty Cycle Control (DCC), thereby generating a combined signal. A twofold resolution gain occurs, compared to related technologies, when sampling is performed at the same frequency. On the other hand, when sampling is performed at half the frequency of related technologies, driving may be performed with half the power at the same resolution.

In an embodiment, the edge combiner 230 detects rising and falling edges from clocks of the PLL 231 to generate a combined signal. Phase duties of the PLL 231 should match to use both rising and falling edges, whereby DCC may be used.

The calculation unit 240 counts single photons by counting events serialized and sampled based on a combined signal of the edge combiner 230. The calculation unit 240 forms a histogram bin according to a target resolution and a dynamic range, and a histogram may be generated by counting events occurring at a predetermined cycle.

The calculation unit 240 may count up two events by generating a carry on a histogramming counter when events are not sampled in the XOR tree but are sampled in the OR tree. By up-counting two events as described above, omission of one among events occurring at the same time may be prevented.

The compensation unit 250 compensates for propagation delay between the OR tree and the XOR tree using a Delay-Locked Loop (DLL). This is possible because serialization of events occurring during a predetermined cycle may be accurately carried out by compensating for propagation delay.

Since a pulse shaper connected to the OR tree and a T flip-flop connected to the XOR tree use flip-flops having the same structure, the same propagation delay may occur. When flip-flops with different structures are used, propagation delay occurs due to such structural difference. Accordingly, difference in propagation delay may be minimized by using the flip-flops having the same structure.

In addition, an OR gate structure constituting the OR tree and an XOR gate structure constituting the XOR tree are constituted of routes having the same driving strength. Accordingly, hardware may be constituted such that propagation delay between the OR tree and the XOR tree is minimized.

Figure 3:
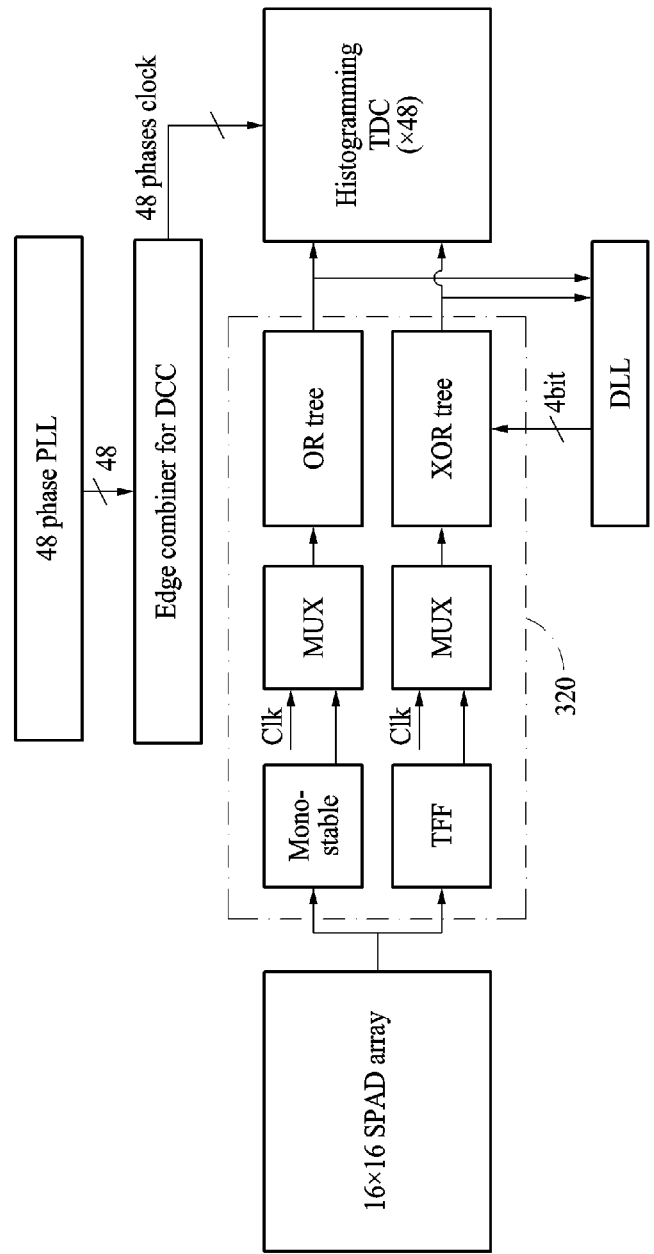
FIG. 3 is a block diagram illustrating an apparatus for counting single photons according to another embodiment of the present disclosure.

FIG. 3 is a block diagram illustrating an apparatus for counting single photons according to another embodiment of the present disclosure.

Referring to FIG. 3, a sampling unit 320 may include a multiplexer (MUX) operating according to a mono-stable pulse shaper and a clock, an OR tree, a T flip-flop, and an XOR tree. All output signals from the SPAD array may be transmitted to a histogramming TDC via the OR tree and the XOR tree. Since all sampled events are detected, an accurate histogram of photons necessary for measurement may be formed. In addition, the number of measurements required for histogramming may be reduced.

Propagation delay of the XOR tree may be compensated for using DLL to fit the OR tree.

Figure 4:
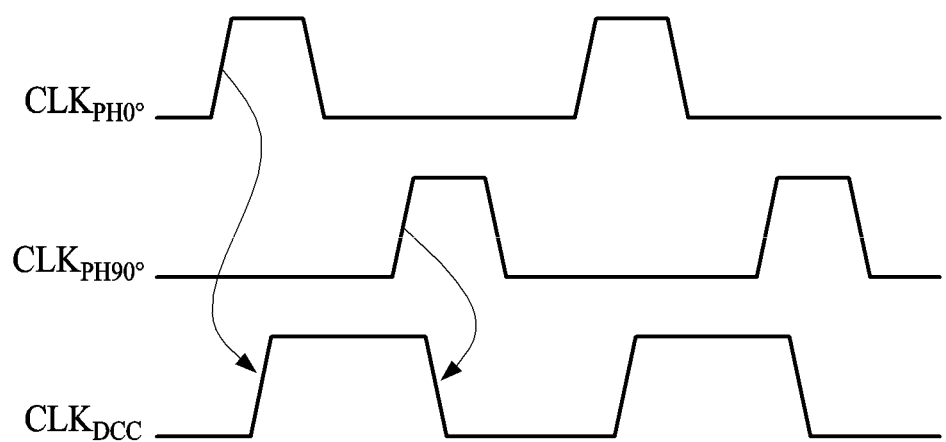
FIG. 4 is a view illustrating the operation of an edge combiner among constructions of an apparatus for counting single photons according to an embodiment of the present disclosure.

FIG. 4 is a view illustrating the operation of an edge combiner among constructions of an apparatus for counting single photons according to an embodiment of the present disclosure.

Referring to FIG. 4, an edge combiner may use all of different clocks of PLL for sampling using a DCC-embedded oscillator structure, thereby generating a combined signal. Both rising edges of a 0-degree phase clock and a 90-degree phase clock are combined for sampling, thereby generating a clock signal.

Figure 5A:
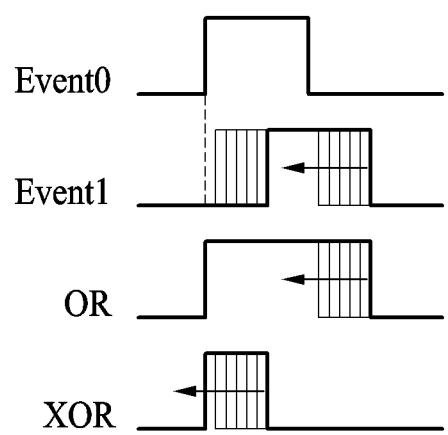
FIG. 5A and FIG. 5B are a view illustrating embodiments of sampling using both an OR tree and an XOR tree in an apparatus for counting single photons according to an embodiment of the present disclosure.
Figure 5B:
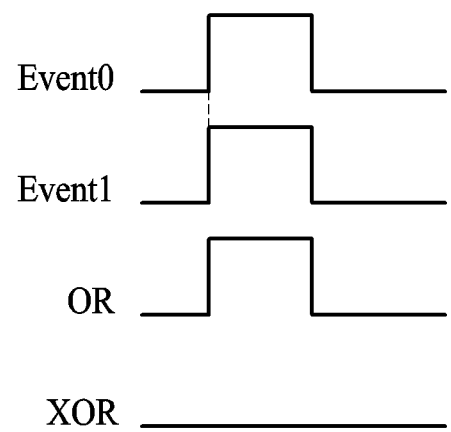

FIG. 5A and FIG. 5B are a view illustrating embodiments of sampling using both an OR tree and an XOR tree in an apparatus for counting single photons according to an embodiment of the present disclosure.

Referring to FIG. 5A, when Event 0 and Event 1 occur at different times, two events are detected from the OR tree and the XOR tree and thus may be used in the TDC.

Referring to FIG. 5B, when Event 0 and Event 1 occur at the same time, one event is recognized at the OR tree and no event is recognized at the XOR tree. When no event is present in the XOR tree and an event is present in the OR tree, the calculation unit 240 may be programmed to count two events.

Figure 6A:
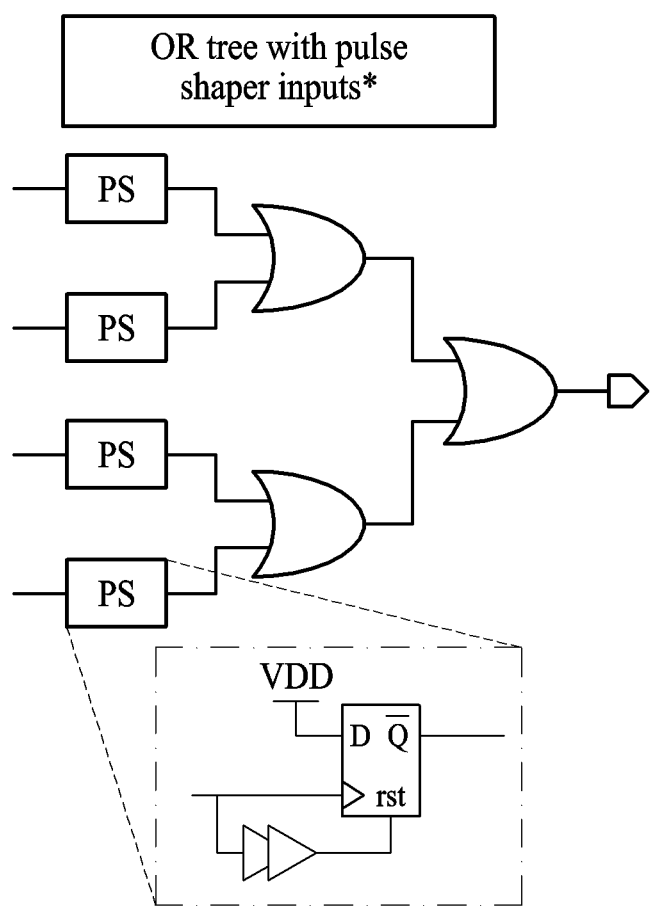
FIG. 6A and FIG. 6B are a view illustrating configurations for minimizing propagation delay of an apparatus for counting single photons according to an embodiment of the present disclosure.
Figure 6B:
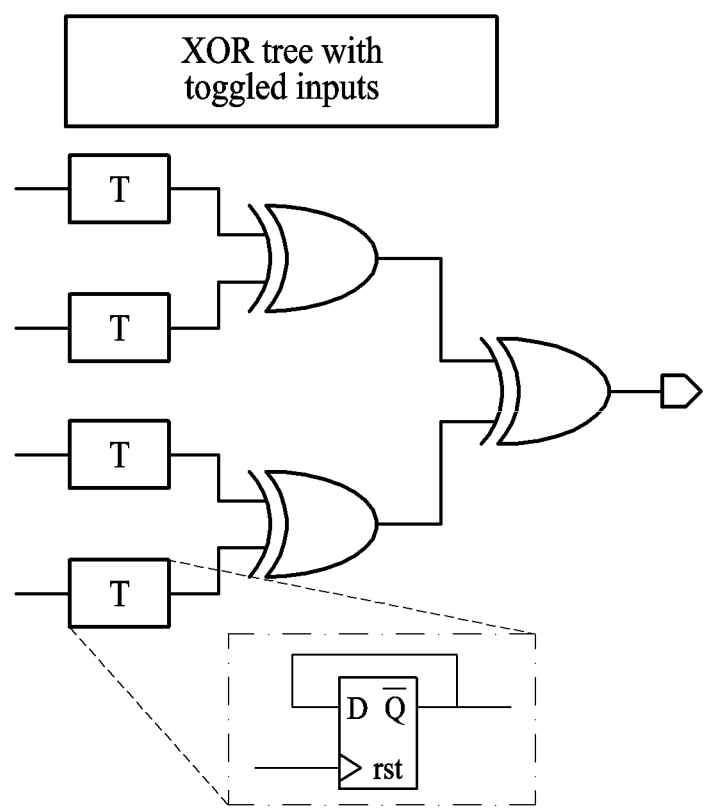

FIG. 6A and FIG. 6B are a view illustrating configurations for minimizing propagation delay of an apparatus for counting single photons according to an embodiment of the present disclosure.

The pulse shaper and the OR tree are connected at three levels as illustrated in FIG. 6A, and the T flip-flop and the XOR tree are connected at three levels as illustrated in FIG. 6B. Accordingly, the same structure is exhibited, whereby the same propagation delay may occur.

Figure 7A:
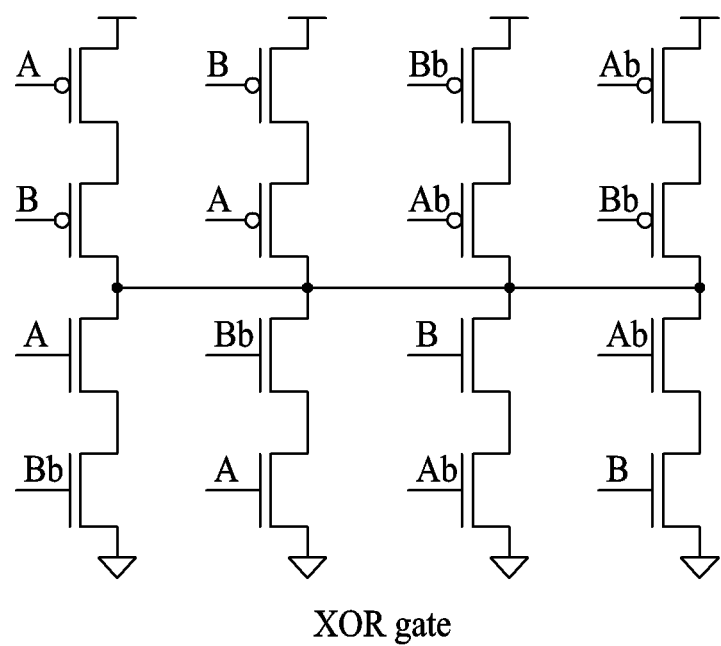
FIG. 7A and FIG. 7B are a view illustrating configurations of an XOR gate and an OR gate of an apparatus for counting single photons according to an embodiment of the present disclosure.
Figure 7B:
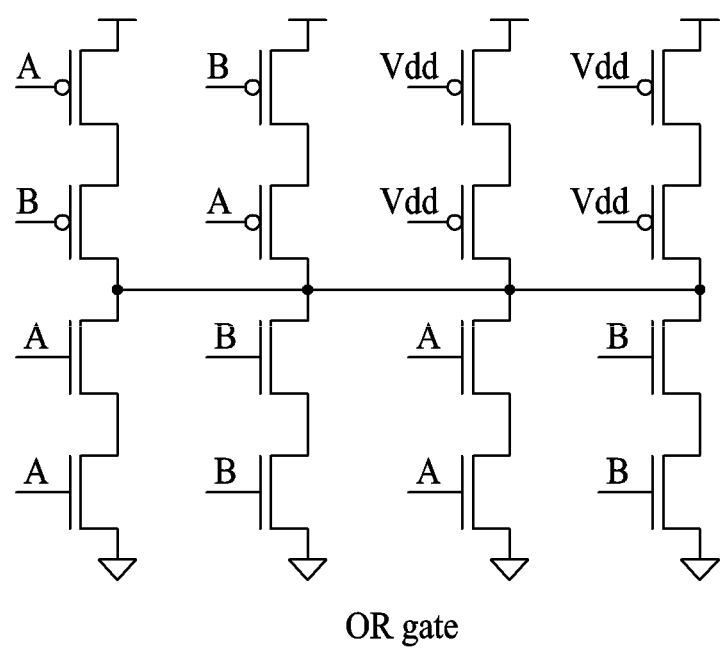

FIG. 7A and FIG. 7B are a view illustrating configurations of an XOR gate and an OR gate of an apparatus for counting single photons according to an embodiment of the present disclosure.

Referring to FIGS. 7A and 7B, an OR gate structure constituting the OR tree and an XOR gate structure constituting the XOR tree may be constituted of a route having the same driving strength.

Figure 8:
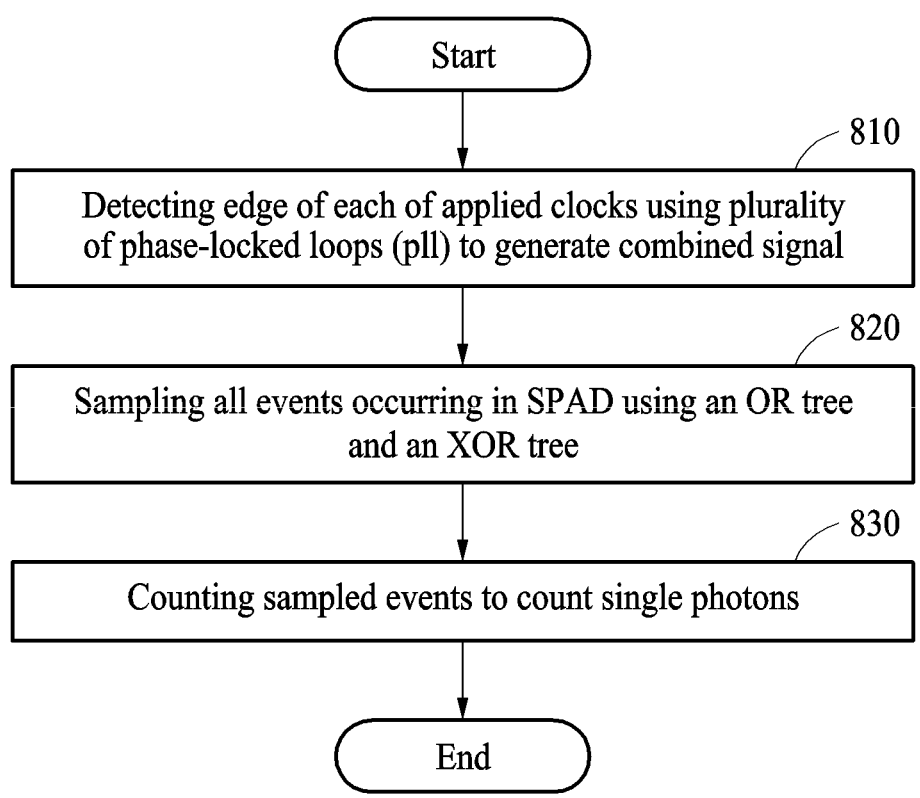
FIG. 8 is a flowchart illustrating a method of counting single photons according to an embodiment of the present disclosure.

FIG. 8 is a flowchart illustrating a method of counting single photons according to an embodiment of the present disclosure.

In step 810, the apparatus for counting single photons according to an embodiment of the present disclosure detects an edge of each applied clock using a plurality of Phase-Locked Loops (PLLs) to generate a combined signal.

The apparatus for counting single photons according to an embodiment of the present disclosure detects rising and falling edges of each clock of the PLL to generate a combined signal.

In step 820, the apparatus for counting single photons according to an embodiment of the present disclosure may sample all events, which occur in each SPAD of a single photon detection diode (SPAD) array, using both an OR tree and an XOR tree.

In step 830, the apparatus for counting single photons according to an embodiment of the present disclosure may count sampled events based on the combined signal and may calculate a photon travel time.

The apparatus for counting single photons according to an embodiment of the present disclosure may up-count two events when events are not sampled in the XOR tree and are sampled in the OR tree.

The apparatus for counting single photons according to an embodiment of the present disclosure may compensate for propagation delay between the OR tree and the XOR tree using DLL.

As apparent from the above description, the apparatus for counting single photons according to an embodiment of the present disclosure may accurately count photons in an SPAD activated by a light source that is reflected by the object of interest.

More particularly, the apparatus for counting single photons according to an embodiment of the present disclosure is characterized by using events serially sampled using both an OR tree and an XOR tree and counting the events using a histogramming Time to Digital Converter (TDC), counting photons of interest.

In addition, the apparatus for counting single photons according to an embodiment of the present disclosure uses all of rising and falling edges of clocks of the Phase-Locked Loop (PLL) for sampling using a Duty Cycle Control (DCC) manner, thereby providing frequency reduction effects and power saving effects.

In an embodiment, the apparatus for counting single photons according to an embodiment of the present disclosure may be applied to Time Correlated Single Photon Counting (TCSPC) applications and Fluorescence Lifetime Imaging Microscopy (FLIM).

The aforementioned device may be realized by hardware component, a software component, and/or a combination of hardware and software components. For example, the device and components described in the embodiments may be realized using one or more general-purpose computers or special-purpose computers such as, for example, a processor, a controller, an arithmetic logic unit (ALU), a digital signal processor, a microcomputer, a field programmable array (FPA), a programmable logic unit (PLU), a microprocessor, or other devices implementing instructions and responding thereto. The processor may execute one or software applications that run on an operating system (OS). In addition, the processor may approach data, store, manipulate, and process the data, and generate new data by responding to running of software. Although one processor has been used to aid in understanding, those skilled in the art can understand that the processor may include a plurality of processing elements and/or a plurality of processing element types. For example, the processor may include a plurality of processors or a combination of one processor and controller. Further, another processing configuration, such as a parallel processor, may be applied.

Software may include a computer program, code, instructions, or a combination of one or more of the foregoing, and may configure a processing device to operate as desired or independently or collectively a command to a processing device. Software and/or data may be permanently or temporarily embodied in the form of any type of machines, components, physical devices, virtual equipment, computer storage media or devices, or a signal wave to be transmitted, so as to be interpreted by a processing device or to provide a command or date to a processing device. Software may be distributed over a networked computer system, and stored or executed in a distributed manner. Software and data may be stored on one or more computer readable media.

Embodiments of the present disclosure can include a computer readable medium including program commands for executing operations implemented through various computers. The computer readable medium can store program commands, data files, data structures or combinations thereof. The program commands recorded in the medium may be specially designed and configured for the present disclosure or be known to those skilled in the field of computer software. Examples of a computer readable recording medium include magnetic media such as hard disks, floppy disks and magnetic tapes, optical media such as CD-ROMs and DVDs, magneto-optical media such as floptical disks, or hardware devices such as ROMs, RAMs and flash memories, which are specially configured to store and execute program commands. Examples of the program commands include a machine language code created by a compiler and a high-level language code executable by a computer using an interpreter and the like. The hardware devices may be configured to operate as one or more software modules to perform operations in the embodiments, and vice versa.

Although exemplary embodiments of the present disclosure have been disclosed for illustrative purposes, those skilled in the art will appreciate that various modifications, additions and substitutions are possible, without departing from the scope and spirit of the disclosure as disclosed in the accompanying claims. For example, proper result may be achieved even if the techniques described above are implemented in an order different from that for the disclosed method, and/or disclosed constituents such as a system, structure, device and circuit are coupled to or combined with each other in a form different from that for the disclosed method or replaced by other constituents or equivalents.

It should be understood, however, that there is no intent to limit the disclosure to the embodiments disclosed, rather, the disclosure is to cover all modifications, equivalents, and alternatives falling within the spirit and scope of the disclosure as defined by the claims.

DESCRIPTION OF SYMBOLS

210: SPAD ARRAY
220: SAMPLING UNIT
230: EDGE COMBINER
231: PLL
240: CALCULATION UNIT
250: COMPENSATION UNIT

What is claimed is:

1. An apparatus for counting single photons, comprising:
    an edge combiner configured to detect an edge of each of applied clocks using a plurality of Phase-Locked Loops (PLL) to generate a combined signal;
    a sampling unit configured to sample all events occurring in each SPAD of a single photon detection diode (SPAD) array using an OR tree and an XOR tree; and
    a calculation unit configured to count the sampled events based on the combined signal to count single photons.

2. The apparatus according to claim 1, wherein the edge combiner detects a rising edge of each of the clocks to generate the combined signal.

3. The apparatus according to claim 1, wherein the edge combiner detects a falling edge of each of the clocks to generate the combined signal.

4. The apparatus according to claim 1, further comprising a compensation unit for compensating propagation delay between the OR tree and the XOR tree using a Delay-Locked Loop (DLL).

5. The apparatus according to claim 1, wherein the calculation unit up-counts two events when events are not sampled in the XOR tree and are sampled in the OR tree.

6. The apparatus according to claim 1, wherein a pulse shaper connected to the OR tree and a T flip-flop connected to the XOR tree use a flip flop with a same structure, whereby same propagation delay occurs.

7. The apparatus according to claim 1, wherein an OR gate structure constituting the OR tree and an XOR gate structure constituting the XOR tree are constituted of a route having same driving strength.

8. A method of counting single photons, the method comprising:
    detecting an edge of each of applied clocks using a plurality of Phase-Locked Loops (PLL) to generate a combined signal;
    sampling all events occurring in each SPAD of a single photon detection diode (SPAD) array using an OR tree and an XOR tree; and
    counting the sampled events based on the combined signal to count single photons.

9. The method according to claim 8, further comprising compensating propagation delay between the OR tree and the XOR tree using DLL.

10. The method according to claim 8, wherein, in the counting, two events are up-counted when events are not sampled in the XOR tree and are sampled in the OR tree.

11. The method according to claim 8, wherein, in the generating, the combined signal is generated by detecting a rising edge of each of the clocks.

* * * * *